(12) United States Patent
Doerr et al.

(10) Patent No.: US 8,914,693 B2
(45) Date of Patent: Dec. 16, 2014

(54) APPARATUS FOR JTAG-DRIVEN REMOTE SCANNING

(75) Inventors: Martin Doerr, Schwaigern (DE);
Benedikt Geukes, Stuttgart (DE);
Holger Horbach, Stuttgart (DE);
Matteo Michel, Chemnitz (DE);
Manfred Walz, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 358 days.

(21) Appl. No.: 13/397,544

(22) Filed: Feb. 15, 2012

(65) Prior Publication Data

US 2013/0212445 A1    Aug. 15, 2013

(51) Int. Cl.
*G01R 31/28* (2006.01)
*G01R 31/3177* (2006.01)
*G01R 31/3185* (2006.01)

(52) U.S. Cl.
CPC .... *G01R 31/3177* (2013.01); *G01R 31/318572* (2013.01)
USPC ............................. 714/729; 714/733; 714/727

(58) Field of Classification Search
CPC ............. G01R 31/2815; G01R 31/317; G01R 31/318575; G01R 31/318544; G01R 31/31717; G01R 31/31725
USPC .................................. 714/726, 727, 729, 733
See application file for complete search history.

(56) References Cited

U.S. PATENT DOCUMENTS

| | | |
|---|---|---|
| 5,434,804 A | 7/1995 | Bock et al. |
| 6,122,762 A | 9/2000 | Kim |
| 6,240,536 B1 | 5/2001 | Mikan, Jr. et al. |
| 6,532,544 B1 | 3/2003 | Masleid et al. |
| 6,539,491 B1 | 3/2003 | Skergan et al. |
| 6,654,917 B1 | 11/2003 | Floyd et al. |
| 6,748,563 B1 | 6/2004 | LeBlanc et al. |
| 7,120,214 B2 | 10/2006 | Takata |

(Continued)

FOREIGN PATENT DOCUMENTS

| | | |
|---|---|---|
| CN | 101382583 | 3/2009 |
| CN | 101719088 | 6/2010 |

OTHER PUBLICATIONS

Xiaodeng Zhang; Roy, K., "Power reduction in test-per-scan BIST," On-Line Testing Workshop, 2000. Proceedings. 6th IEEE International , vol., no., pp. 133,138, 2000.*

(Continued)

*Primary Examiner* — Cynthia Britt
(74) *Attorney, Agent, or Firm* — Steven L. Bennett; Jack V. Musgrove (57) ABSTRACT

A scan circuit (JTAG 1149 extension) for a microprocessor utilizes transport logic and scan chains which operate at a faster clock speed than the external JTAG clock. The transport logic converts the input serial data stream (TDI) into input data packets which are sent to scan chains, and converts output data packets into an output data stream (TDO). The transport logic includes a deserializer having a sliced input buffer, and a serializer having a sliced output buffer. The scan circuit can be used for testing with boundary scan latches, or to control internal functions of the microprocessor. Local clock buffers can be used to distribute the clock signals, controlled by thold signals generated from oversampling of the external clock. The result is a JTAG scanning system which is not limited by the external JTAG clock speed, allowing multiple internal scan operations to complete within a single external JTAG cycle.

12 Claims, 5 Drawing Sheets

(56) References Cited

U.S. PATENT DOCUMENTS

| | | | |
|---|---|---|---|
| 7,484,153 | B2 | 1/2009 | Kiryu et al. |
| 7,550,995 | B1 | 6/2009 | Guilloteau et al. |
| 7,650,542 | B2 | 1/2010 | Sweet et al. |
| 7,779,320 | B2 * | 8/2010 | Chmelar ............ 714/726 |
| 7,908,534 | B2 | 3/2011 | Motika et al. |
| 7,917,819 | B2 | 3/2011 | Talayssat et al. |
| 7,979,762 | B2 | 7/2011 | Esaka et al. |
| 8,510,616 | B2 * | 8/2013 | Singhal ............ 714/729 |
| 2003/0074616 | A1 * | 4/2003 | Dorsey ............ 714/733 |
| 2003/0163773 | A1 | 8/2003 | O'Brien et al. |
| 2009/0217112 | A1 * | 8/2009 | Eckelman et al. ............ 714/723 |
| 2009/0249145 | A1 | 10/2009 | Iwami et al. |
| 2010/0192031 | A1 | 7/2010 | Warren |
| 2010/0251045 | A1 | 9/2010 | Hapke et al. |

OTHER PUBLICATIONS

Whetsel, L., "Adapting scan architectures for low power operation," Test Conference, 2000. Proceedings. International , vol., no., pp. 863,872, 2000.*

Li, Jia et al., "A Scan Chain Adjustment Technology for Test Power Reduction", Proc. 15th Asian Test Symposium IEEE Computer Society (2006).

Indian Institute of Technology (Kharagpur), Module 8 "Testing of Embedded System", Lesson 41 "Boundary Scan Methods and Standards", National Programme on Technology Enhanced Learning, Chennai, India [online], retrieved on Feb. 13, 2012, from the Internet URL: http://nptel.iitm.ac.in/courses/Webcourse-contents/IIT%20Kharagpur/Embedded%20systems/Pdf/Lesson-41.pdf.

Balaz, Marcel, "Contribution to Digital System Testing Methods", Information Sciences and Technologies Bulletin of the ACM Slovakia, vol. 2, No. 2, pp. 16-23 (2010).

Xiaojun, Ma, "Boundary-scan Test Circuit Designed for FPGA", Proc. 5th Int'l. Conf. Annual Summer Interdisciplinary Conference, vol. 2, pp. 1190-1193 (Oct. 2003).

Xilinx, "Boundary-Scan in XC4000, Spartan™ and XC5200 Series Devices", Application note (Nov. 16, 1999).

Kim, Insoo et al., "Operation About Multiple Scan Chains Based on System-On-Chip" abstract [online], retrieved on Feb. 13, 2012, from the Internet URL: ieeexplore.ieee.org/xpl/freeabs_all.jsp?arnumber=4815716.

Lefebrve, M.E., "Functional Test and Diagnosis: A Proposed JTAG Sample Mode Scan Tester" abstract [online], retrieved on Feb. 13, 2012, from the Internet URL: ieeexplore.ieee.org/xpl/freeabs_all.jsp?arnumber=114035.

Ngo, Be Van, "Use of JTAG Boundary-Scan for Testing Electronic Circuit Boards and Systems" abstract [online], retrieved on Feb. 13, 2012, from the Internet URL: ieeexplore.ieee.org/xpl/freeabs_all.jsp?arnumber=4662576.

Tehranipour, M.H."Testing SoC Interconnects for Signal Integrity Using Extended JTAG Architecture" abstract [online], retrieved on Feb. 13, 2012, from the Internet URL: ieeexplore.ieee.org/xpl/freeabs_all.jsp?arnumber=1291589.

* cited by examiner

APPARATUS FOR JTAG-DRIVEN REMOTE SCANNING

BACKGROUND OF THE INVENTION

1. Field of the Invention

The present invention generally relates to data processing systems, and more particularly to a method of operating or testing a microprocessor or other computer system component using a scan chain which sequentially shifts through a serial data stream supplied by an external source.

2. Description of the Related Art

Integrated circuits are used for a wide variety of electronic applications, from simple devices such as wristwatches, to the most powerful computer systems. A microelectronic integrated circuit chip can generally be thought of as a collection of logic cells with electrical interconnections between the cells, formed on a semiconductor substrate (e.g., silicon). An integrated circuit may include a very large number of cells and require complicated connections between the cells, including different layers of conducting media available for routing.

Figure 1:
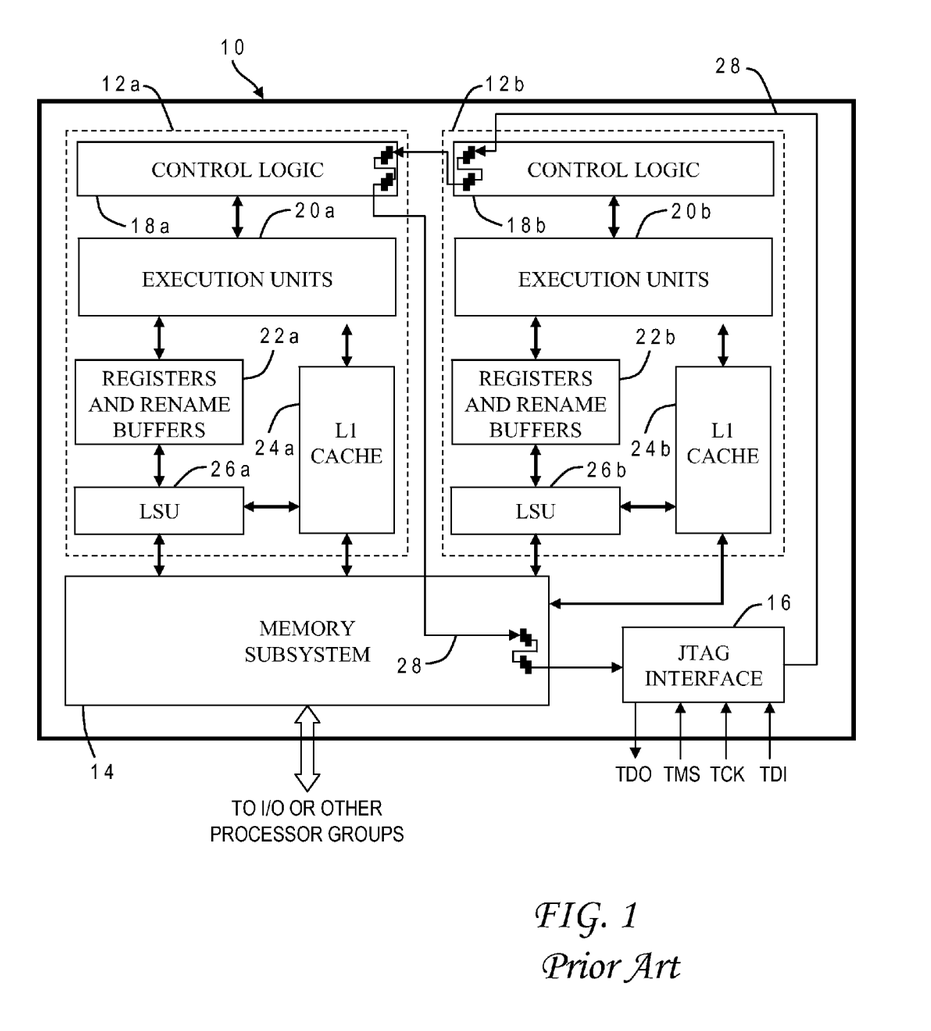
FIG. 1 is a high-level block diagram of a conventional dual-core processing unit showing a JTAG interface for a scan chain interconnecting scan cells embedded in functional components in a ring fashion.

Integrated circuits have become increasingly complex, particularly devices used as computer system components such as microprocessors, adapter chips, etc. These intricate designs are buried in the microchip layers, and so can be difficult to test or otherwise assure proper performance. Different approaches have been devised for testing integrated circuits, one of which involves the use of a serial data stream forming a test pattern which is fed into selected inputs of the integrated circuit. An early version of this technique known as Level Sensitive Scan Design (LSSD) utilized a scan line or chain which interconnects a multitude of control latches embedded in the integrated circuit. The data stream sets the control latches to predefined states as desired by the testing routine. This design has evolved into the Institute of Electrical and Electronics Engineers' Joint Test Action Group (JTAG) standard 1149 for boundary scan testing. FIG. 1 illustrates a simplified example of pervasive logic which can be embedded within a processing unit 10 to implement the JTAG standard. Processing unit 10 is constructed as a single integrated circuit semiconductor device, and is generally comprised of two processor cores 12a and 12b, a memory subsystem 14, and a JTAG interface 16. Although two processor cores are shown as included on one integrated chip 10, there could be fewer or more. Each processor core 12a, 12b has its own control logic 18a, 18b, separate sets of execution units 20a, 20b and registers/buffers 22a, 22b, respective first level (L1) caches 24a, 24b, and load/store units (LSUs) 26a, 26b. Execution units 20a, 20b include various arithmetic units such as fixed-point units and floating-point units, as well as instruction fetch units and instruction sequencer units. Registers 20a, 20b include general-purpose registers, special-purpose registers, and rename buffers. L1 caches 26a, 26b (which are preferably comprised of separate instruction and data caches in each core) and load/store units 24a, 24b communicate with memory subsystem 14 to read/write data from/to the memory hierarchy. Memory subsystem 14 may include a second level (L2) cache and a memory controller.

JTAG interface 16 has several external inputs including a data stream TDI, a state signal TMS, and a clock signal TCK, and has one external output, data stream TDO. The TCK signal is separate from the functional clocks used by cores 12a, 12b and memory subsystem 14 or other components of microprocessor 10. The JTAG inputs and output may be connected to a service processor or console device which controls a JTAG test routine. Internal to processing unit 10, JTAG 16 has a single scan chain 28 which interconnects several sets of latches or satellites that are embedded in the functional units in a ring fashion; in this example, there are sets of scan latches shown in each control logic 18a, 18b of cores 12a, 12b, and another set shown in memory subsystem 14. Operation of the test interface is governed by test access port circuitry which is essentially a state machine whose transitions are controlled by the TMS and TCK signals. While only three scan satellites are illustrated for simplicity, those skilled in the art understand that there can be hundreds of thousands of satellites in state-of-the-art designs.

Extensions to the JTAG standard 1149 can allow a system to additionally execute and control internal functional aspects of the integrated circuit. For example, the scan satellites may have internal control and error registers (along with mode, status, etc., registers) which can be used to enable and check various functions in the components. Any subset of the registers in any component on the chip may be so enabled. The chip designer can select whatever configuration might be desirable for the particular application, e.g., fault indicators for a diagnostics routine. In this manner, a service processor or test device can access any chip in a multi-processing system via JTAG interface 16 and access registers while the system is running, without interruption, to set modes, pulse controls, initiate interface alignment procedures, read status of FIRs, etc. These functions may be carried out using an additional controller (not shown) which sets an internal command register and an internal data register, and assembly code running on a component, particularly in the processor cores 12a, 12b, can allow the cores to utilize these features. For example, a core can read status bits of another component and control the logic anywhere on its own chip, and can further access components on other chips via other JTAG interfaces.

SUMMARY OF THE INVENTION

The present invention is generally directed to a method and apparatus for scanning pattern data into a scan chain which interconnects multiple scan cells embedded in one or more functional units of an integrated circuit semiconductor device, by receiving an external clock signal from a source outside the integrated circuit at a scan interface of the integrated circuit, the external clock signal having first frequency, receiving an input serial data stream representing the pattern data at an input of the scan interface of the integrated circuit, passing the input serial data stream from the input of the scan interface to the scan chain as shift data using first transport logic, shifting the shift data through the scan chain controlled by an internal clock signal to generate return data, the internal clock signal having a second frequency which is faster than the first frequency, and passing the return data from the scan chain to an output of the scan interface as an output serial data stream using second transport logic. The internal clock signal is preferably generated by oversampling the external clock signal. The input serial data stream may be passed to the scan chain by converting at least a portion of the input serial data stream into an input data packet, and sending the input data packet to the scan chain using a transport protocol; similarly, the return data may be passed to the scan output by receiving an output data packet from the scan chain using the transport protocol, and converting the output data packet into at least a portion of the output serial data stream. In the illustrative embodiment, the first transport logic includes an input buffer having multiple input buffer slices which receive portions of the input serial data stream, and the second transport logic includes an output buffer having multiple output buffer slices which transmit portions of the output serial data stream. In one implementation the pattern data is operational data and the scan cells are control registers which enable a function of the one or more functional units. In an alternative implementation the pattern data is test data and the scan cells are boundary scan latches. The invention can be applied to a scan circuit having multiple scan chains as well, in which case the first and second transport logic have multiplexing means to select the correct scan chain for the input/output packets. The invention can provide additional clock domains, for example, the first transport logic and the second transport logic can be controlled by a second internal clock signal which is also faster than the external clock.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Testing or circuit control using a scan chain which sequentially shifts data through scan cells is very helpful to circuit designers, but this approach has several drawbacks. Sequential scanning allows only shifting of latches which are located on one single scan chain, i.e., all of the scan latches are connected to each other. The scan speed accordingly limits the distance between two latches on the scan chain. Conversely, if a larger distance is desired between a sequential pair of latches then the scan speed is limited. However, the scan speed (the external JTAG clock TCK) also determines the overall operational speed of the test or operation. For very large scan chains, it can take an excessive amount of time to shift through all of the data. Modern testing with the JTAG standard may involve shifting millions of bits through a scan chain. The TCK duration additionally limits the complexity of internal operations triggered by a JTAG instruction. Typical TCK speeds are in the range of 10-25 MHz.

Another problem relates to distribution of the clock signal for the scan chain. The entire scan chain must be driven by the same shifting clock, i.e., the external JTAG clock must be distributed to all internal latches. As the number of latches continues to grow, the JTAG clock tree likewise grows in complexity, making the design even more difficult to synthesize.

In light of the foregoing, it would be desirable to devise an improved method of JTAG scanning which is not so limited by the external JTAG clock speed or the JTAG clock tree. It would be likewise be advantageous if the method could allow multiple internal scan operations to complete within a single external JTAG cycle. The present invention achieves these objects by providing a new clock signal for the scan chain which is faster than the JTAG clock. The invention may further advantageously be implemented with a clock mesh which uses oversampling of the JTAG clock. Hold signals from the test access port can be used to indicate to local clock buffers of the mesh when to honor the signal used for internal clock distribution.

Figure 2:
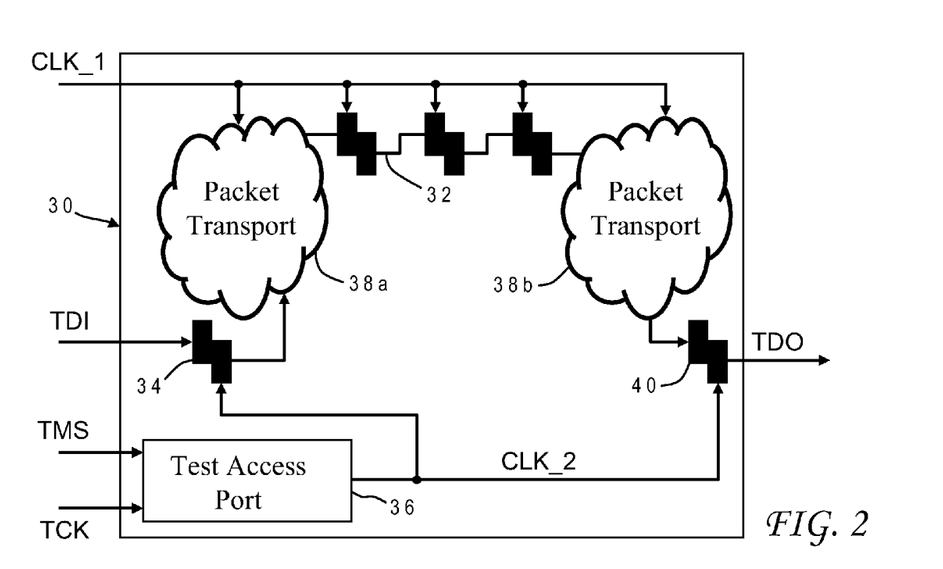
FIG. 2 is a high-level block diagram of one embodiment of an integrated circuit constructed in accordance with the present invention having a single scan chain which is controlled by a faster clock than the test clock supplied by the JTAG interface.

With reference now to the figures, and in particular with reference to FIG. 2, there is depicted one embodiment 30 of an integrated circuit constructed in accordance with the present invention. Integrated circuit 30 may be for example a microprocessor, but this example is not meant to be construed in a limiting sense as the present invention is applicable to any type of semiconductor device, including a "system on a chip" or more complicated microprocessors than that illustrated in FIG. 1, e.g., a microprocessor with higher level (on-board) caches. Integrated circuit 10 includes various functional units (not shown in FIG. 2) according to the nature of the design. Integrated circuit 30 additionally includes pervasive logic for testing and/or operation which uses a scan chain 32 interconnecting a plurality of scan cells, e.g., latches, that are inputs or outputs of the functional units. However, scan chain 32 is not clocked by the external JTAG signal TCK, but rather is controlled by a separate clock signal CLK_1. The local CLK_1 signal is shown as originating external to integrated circuit 30, but it could be generated internally as well using conventional components such as an oscillator and phase-lock loop.

In this implementation, the data stream TDI is transmitted to an input latch 34 which is controlled by the slower TCK signal via a test access port 36 (i.e., JTAG interface). The output of input latch 34 is connected to a first packet transport circuit 38a. Packet transport circuit 38a converts the serial data stream into data packets using any convenient packet protocol, e.g., TCP/IP. The packets are then sent down scan chain 32 at the faster CLK_1 speed, and are processed by each scan cell in the chain according to the particular protocol used. The output of scan chain 32 is connected to a second packet transport circuit 38b which takes the packet data and converts it back into a serial stream, and forwards it to an output latch 40. The output of output latch 40 is the JTAG-compliant TDO scan data. Thus, while the scan chain is able to complete its operations faster, these operations are transparent to the external JTAG master which sees only a normal JTAG interface controlled by the slower JTAG clock. While the illustrative embodiment utilizes TCP/IP, other transport mechanisms/protocols could be used, such as PCI Express, Infiniband, or HyperTransport.

Figure 3:
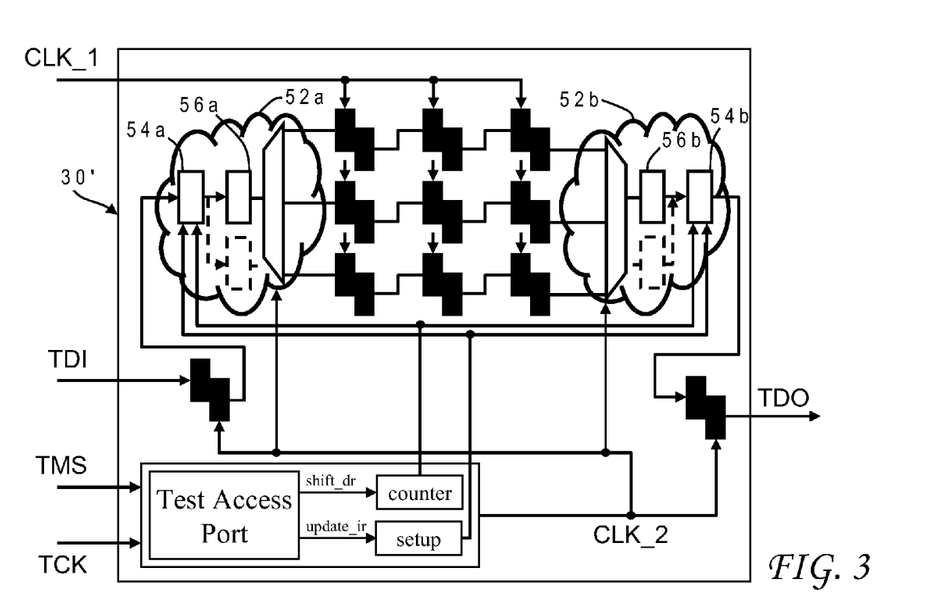
FIG. 3 is a high-level block diagram of another embodiment of an integrated circuit constructed in accordance with the present invention having multiple scan chains controlled by a separate (faster) clock.

Referring now to FIG. 3, there is depicted a more complicated embodiment 30' of an integrated circuit constructed in accordance with the present invention. Integrated circuit 30' uses a similar packet transport protocol for scan testing/operation, but now has multiple scan chains. A second internal clock CLK_2 is used for the TAP as well as other internal circuitry excluding the scan chain (the two protocol engines could further run on separate clocks). The frequency of the CLK_2 signal is similarly faster than the frequency of TCK. The front end transport circuit 52a includes a deserializer 54a and shift setup encode logic 56a which buffer the input data stream for selective transmission to one of the scan chains. The back end transport circuit 52b similarly includes shift setup decode logic 56b and a serializer 54b which construct the output data stream from the buffered data packets.

Figure 4A:
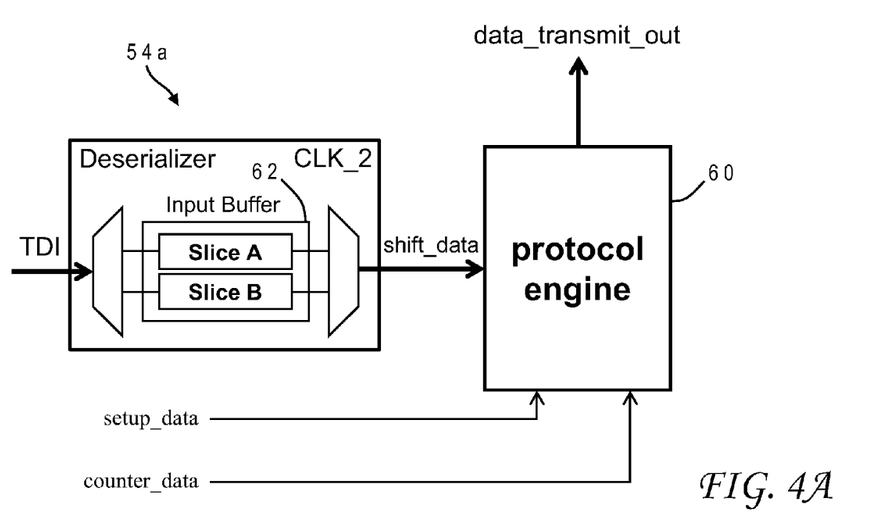
FIGS. 4A and 4B are block diagrams of a deserializer and a serializer used according to one implementation of the present invention in conjunction with a protocol engine to convert an input scan data stream into separate data packets for multiple scan chains and to convert data packets from the multiple scan chains back into an output scan data stream.
Figure 4B:
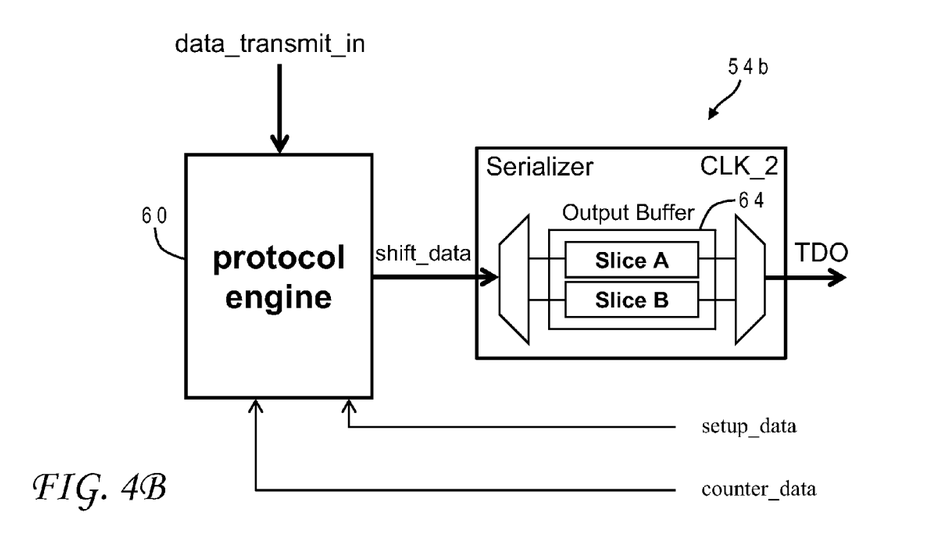
Figure 5:
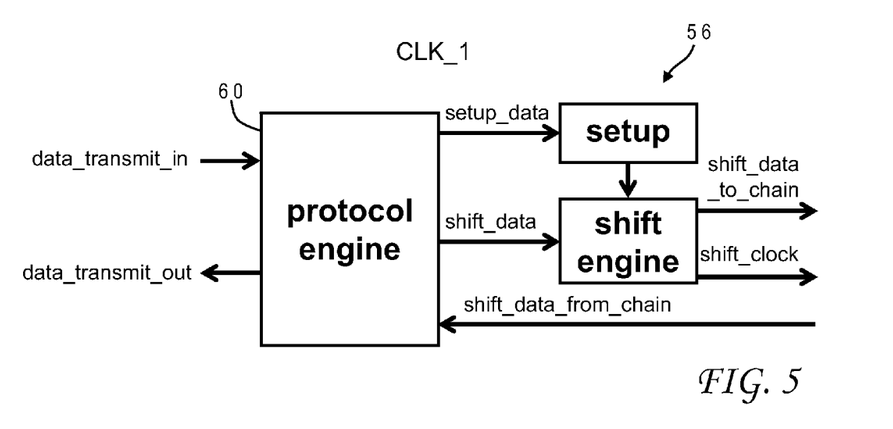
FIG. 5 is a block diagram of setup logic used in conjunction with the deserializer and serializer of FIGS. 4A and 4B according to one implementation of the present invention to setup data packets for the different scan chains.

Buffering is particularly advantageous due to the latency of the transport protocol being used, and can be better understood with reference to FIGS. 4A-4B and 5. As the external JTAG master is sending JTAG scan operations to the chip, the test access port (TAP) logic decodes the JTAG instructions. When a JTAG instruction for remote scanning is decoded to switch the JTAG engine to the Update-IR state (which the JTAG standard uses to indicate that the TAP controller's instruction register should be updated), a protocol engine 60 is fed with setup data to configure the scan chain multiplexer for the different scan chains. The setup data may consist of the multiplexer selection control, a shift length, and a shift speed, based on the details of the particular implementation. When the JTAG engine moves to the Shift-DR state (which the JTAG standard uses to indicate that test/operational data is incoming), the serial JTAG data stream is shifted into one slice (slice A) of an input buffer 62. A counter can be used to control the resulting data packet size. Once the shift in data reaches the size of the buffer slice (or the test access port is leaving the Shift DR state), the content of slice A is forwarded to protocol engine 60. At this same time, the serial data stream on the TDI line switches, to route the data to slice B for creation of the next data packet.

As seen in FIG. 5, protocol engine 60 forwards the data packet to shift setup encode logic 56a along with the setup data. A shift engine selectively sends the packet as shift data to the designated scan chain, shifting the scan chain with the input slice data by the number of bits in the slice, i.e., the data is shifted in chunks the size of the input buffer slices. Protocol engine 60 also receives the shift data from the chain so, as protocol engine 60 is passing pattern data from deserializer 54a to the scan chains, it can be passing return data selectively from another scan chain to serializer 54b simultaneously (on the same trigger from the JTAG Shift-DR state). As further seen in FIG. 4B, serializer 54b includes a similar buffer structure as deserializer 54a, but this time serving as an output buffer 64. In a similar interleaving manner, when one slice of output buffer 64 is receiving data from the protocol engine, the other slice of output buffer 64 can be placing the data on the output TDO serial line.

In the simplified example of FIG. 3 there are three scan chains which are accessed via one set of multiplexers, but in implementations having a large number of scan chains they can further be arranged in multiple sets each having respective multiplexers. In such a case additional shift setup encode/decode logic circuits can be provided as indicated by the dashed lines in FIG. 3.

In the illustrative implementation, the input buffer and output buffer each consist of two slices having the same size, but the size and number of buffers may vary. An appropriate size of the input/output buffers can generally be determined by the latency of the chosen protocol and its associated protocol engine. To cover increased latency either the number of slices or the size of each slice can be increased. The buffer size may also be increased for higher TCK clock speeds.

By using multiple input buffer slices and output buffer slices, the overhead from the protocol usage is completely hidden from the external JTAG master. However, chip internal JTAG functionality or JTAG triggered protocols need to run faster than the JTAG external master device. While any increase of the scan clock signal CLK_1 over the JTAG clock signal TCK can be advantageous, the invention preferably uses a CLK_1 clock speed that is at least five times the TCK clock speed, and more preferably about ten times faster, e.g., for a JTAG clock operating at 25 MHz the CLK_1 signal can be 250 MHZ. The multiple scan chains could further be operated in parallel with appropriate interleaver logic (not shown).

Figure 6:
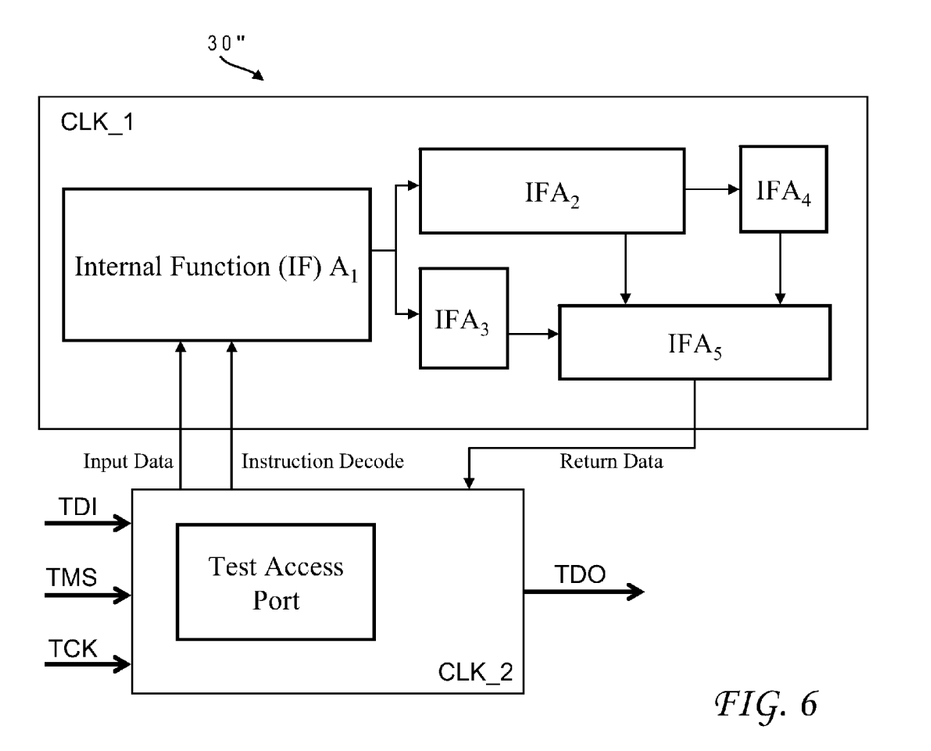
FIG. 6 is a block diagram of still another embodiment of an integrated circuit constructed in accordance with the present invention wherein internal functions of the integrated circuit are controlled by the scan chain in the separate (faster) clock domain.

While the invention is applicable to testing wherein the scan satellites are boundary scan latches, it is equally applicable to operational uses wherein the scan satellites comprise storage elements, control registers, etc. FIG. 6 illustrates such an implementation 30" wherein various complex internal functions (IFA$_1$-IFA$_5$) are accessed via the scan chain. All of the internal functions are part of the CLK_1 clock domain, separate from the CLK_2 clock domain used by the test access port. Only one scan chain is illustrated in FIG. 6, but the invention could be implemented with multiple scan chains for different sets of internal functions. In such a case, the different sets of internal functions could have different internal clock domains, i.e., a different domain for each scan chain (additional clock domains can be provided which are not synchronous with either CLK_1 or TCK).

Figure 7:
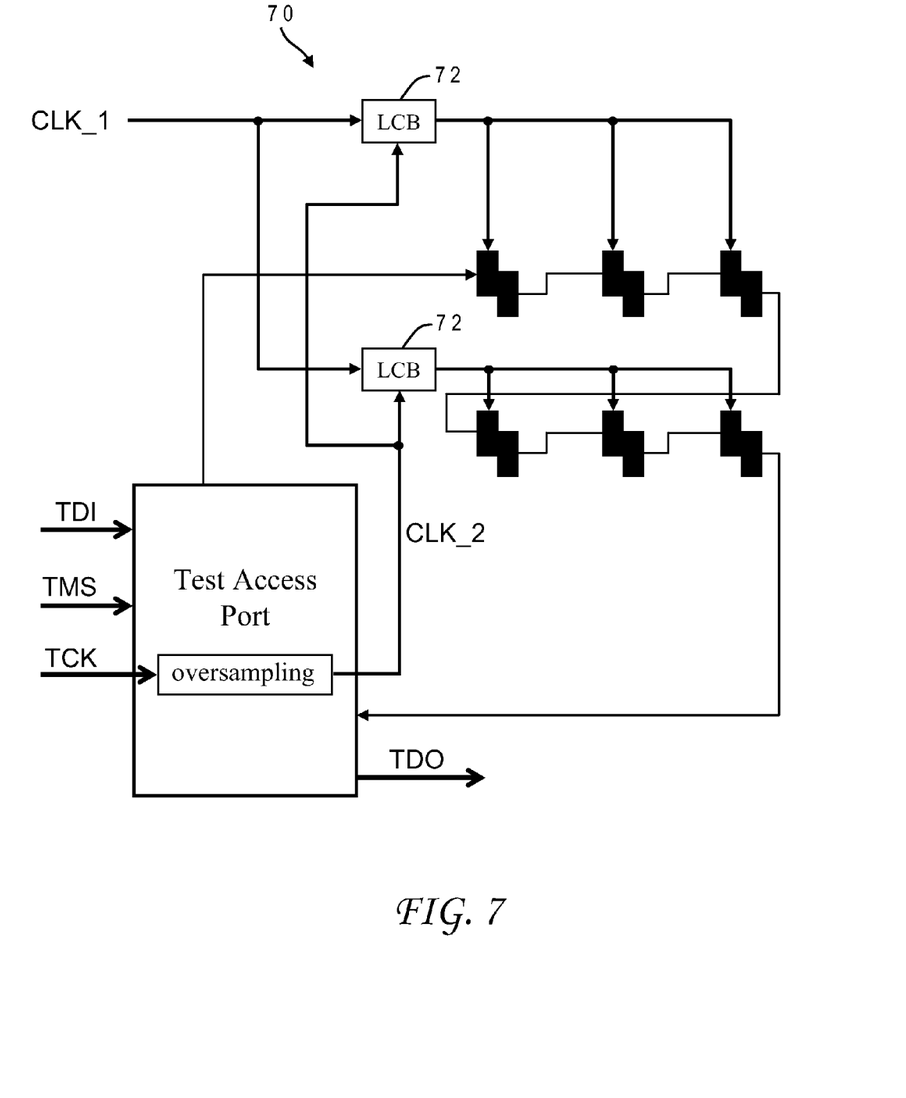
FIG. 7 is a block diagram of yet another embodiment of an integrated circuit constructed in accordance with the present invention illustrating oversampling of the external JTAG clock signal to generate thold signals which are used to control local clock buffers that distribute the scan chain clock signal.

In the preferred embodiments of the invention all chip-internal scan logic is running on the faster clock, although the JTAG logic still reacts on rising and falling edges of the external TCK signal. The internal logic further preferably runs synchronously to maintain JTAG clock-to-data correspondence. FIG. 7 depicts a preferred clock distribution system 70 for the present invention. Clock distribution system 70 utilizes local clock buffers (LCBs) 72 to create a clock mesh or grid that more efficiently distributes the synchronized clock signals compared to the large conventional JTAG clock trees. LCBs 72 are controlled (gated) by thold signals generated from oversampling of the TCK signal (e.g., CLK_2). The clock grid may re-use existing clock facilities on the chip.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A scan circuit for a semiconductor device having one or more functional units, comprising:
    at least one scan chain which interconnects multiple scan cells embedded in the one or more functional units, said scan chain being controlled by an internal clock signal having a first frequency;

a scan interface including a scan input and a scan output, said scan interface being controlled by an external clock signal having a second frequency which is slower than the first frequency;

first transport logic which passes an input serial data stream representing pattern data from said scan input to said scan chain; and second transport logic which passes an output serial data stream from said scan chain to said scan output.

2. The scan circuit of claim 1 wherein:

said first transport logic converts at least a portion of the input serial data stream into an input data packet, and sends the input data packet to said scan chain using a transport protocol; and said second transport logic receives an output data packet from said scan chain using the transport protocol, and converts the output data packet into at least a portion of the output serial data stream.

3. The scan circuit of claim 2 wherein:

said first transport logic includes an input buffer which receives the portion of the input serial data stream; and said second transport logic includes an output buffer which transmits the portion of the output serial data stream.

4. The scan circuit of claim 1 wherein the internal clock signal is generated by oversampling the external clock signal.

5. The scan circuit of claim 1 wherein the pattern data is operational data and the scan cells are control registers which enable a function of the one or more functional units.

6. The scan circuit of claim 1 wherein the pattern data is test data and the scan cells are boundary scan latches.

7. The scan circuit of claim 1 wherein:

said scan chain is a first scan chain among a plurality of scan chains of the semiconductor device which are accessible by said first transport logic and said second transport logic;

said first transport logic includes first multiplexer means for selectively passing the input serial data stream to said first scan chain; and said second transport logic includes second multiplexer means for selectively passing the output serial data stream from said first scan chain.

8. The scan circuit of claim 1 wherein the internal clock signal is a first internal clock signal, and said first transport logic and said second transport logic are controlled by a second internal clock signal, the second internal clock signal having a third frequency which is faster than the first frequency.

9. A microprocessor comprising:

a plurality of functional units including one or more processor cores and a memory subsystem operatively connected to said one or more processor cores;

a plurality of scan chains which interconnect respective sets of scan cells embedded in said functional units, said scan chains being controlled by an internal clock signal having a first frequency;

a scan interface including a scan input and a scan output, said scan input and said scan output being controlled by an external clock signal having a second frequency which is slower than the first frequency;

first transport logic which converts an input serial data stream at said scan input into input data packets, and selectively sends the input data packets to said scan chains using a transport protocol; and second transport logic which selectively receives output data packets from said scan chains using the transport protocol, and converts the output data packets into an output serial data stream at said scan output.

10. The boundary scan circuit of claim 9 wherein said first transport logic and said second transport logic use a common protocol engine to convert the input serial data stream into the input data packets and to convert the output data packets into the output serial data stream.

11. The boundary scan circuit of claim 9 wherein:

said first transport logic includes an input buffer having multiple input buffer slices which receive portions of the input serial data stream; and said second transport logic includes an output buffer having multiple output buffer slices which transmit portions of the output serial data stream.

12. The boundary scan circuit of claim 9 wherein the internal clock signal is a first internal clock signal, and said first transport logic and said second transport logic are controlled by a second internal clock signal, the second internal clock signal having a third frequency which is faster than the first frequency.

* * * * *